United States Patent
Yoshida et al.

(10) Patent No.: US 7,253,520 B2
(45) Date of Patent: Aug. 7, 2007

(54) CSP SEMICONDUCTOR DEVICE HAVING SIGNAL AND RADIATION BUMP GROUPS

(75) Inventors: Hideaki Yoshida, Tokyo (JP); Tae Yamane, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/940,783

(22) Filed: Sep. 15, 2004

(65) Prior Publication Data

US 2005/0035469 A1    Feb. 17, 2005

Related U.S. Application Data

(62) Division of application No. 10/259,484, filed on Sep. 30, 2002, now Pat. No. 6,841,873.

(30) Foreign Application Priority Data

Oct. 11, 2001    (JP)    ............................ 2001-313592

(51) Int. Cl.
    *H01L 23/48*    (2006.01)
    *H01L 23/12*    (2006.01)
    *H01L 23/367*   (2006.01)
    *H01L 23/485*   (2006.01)
    *H01L 23/34*    (2006.01)

(52) U.S. Cl. .................. 257/738; 257/E23.021; 257/E23.105; 257/737; 257/778; 257/734; 257/349; 257/459; 257/759; 257/782; 257/700; 257/701; 257/774; 257/773; 257/732

(58) Field of Classification Search ........ 257/E23.021, 257/E23.105, 737, 738, 734, 773, 774, 778, 257/782, 680, 700, 701, 349, 459, 759, 732, 257/730, 784

See application file for complete search history.

(56) References Cited

U.S. PATENT DOCUMENTS

| | | | |
|---|---|---|---|
| 5,329,423 | A | 7/1994 | Scholz |
| 5,554,887 | A | 9/1996 | Sawai et al. |
| 6,091,141 | A | 7/2000 | Heo |
| 6,258,705 | B1 | 7/2001 | Chien et al. |
| 6,512,298 | B2 | 1/2003 | Sahara et al. |
| 6,597,070 | B2 | 7/2003 | Miyazaki |
| 6,667,230 | B2 | 12/2003 | Chen et al. |
| 6,885,109 | B2 * | 4/2005 | Yamaguchi ............... 257/787 |
| 6,987,054 | B2 * | 1/2006 | Fukasawa et al. .......... 438/465 |
| 2002/0027257 | A1 | 3/2002 | Kinsman et al. |

(Continued)

FOREIGN PATENT DOCUMENTS

JP    03-011666    1/1991

(Continued)

*Primary Examiner*—Alexander Oscar Williams
(74) *Attorney, Agent, or Firm*—Rabin & Berdo, PC

(57) ABSTRACT

A semiconductor device comprises a semiconductor chip which has a first surface, a pad which is formed directly on the first surface, an oxide film which is formed on the first surface, an insulating film which is formed on the oxide film and a part of the pad, a conductive film which is formed on the insulating film and the pad, a sealing material which covers a part of the conductive film and the insulating film and a bump which is formed over the conductive film, wherein the bump is exposed from a surface of the sealing material.

16 Claims, 6 Drawing Sheets

U.S. PATENT DOCUMENTS

| | | |
|---|---|---|
| 2002/0038890 A1 | 4/2002 | Ohuchi |
| 2002/0063341 A1* | 5/2002 | Fukumi ..................... 257/777 |
| 2002/0190336 A1 | 12/2002 | Shimizu et al. |
| 2003/0073300 A1 | 4/2003 | Chen et al. |
| 2003/0127502 A1 | 7/2003 | Alvarez |
| 2003/0134496 A1 | 7/2003 | Lee et al. |
| 2003/0139020 A1* | 7/2003 | Estacio ..................... 438/462 |
| 2003/0146504 A1* | 8/2003 | Yamane ..................... 257/736 |
| 2003/0148552 A1* | 8/2003 | Halahan ..................... 438/106 |
| 2003/0209806 A1 | 11/2003 | Akagawa |
| 2003/0222671 A1* | 12/2003 | Cram ......................... 324/765 |
| 2004/0007384 A1* | 1/2004 | Soga et al. ................. 174/260 |
| 2004/0018693 A1 | 1/2004 | Shioga et al. |
| 2006/0030127 A1* | 2/2006 | Fukasawa et al. .......... 438/460 |

FOREIGN PATENT DOCUMENTS

| | | |
|---|---|---|
| JP | 04-059949 | 5/1992 |
| JP | 05/055418 | 3/1993 |
| JP | 09-213696 | 8/1997 |
| JP | 09-246416 | 9/1997 |
| JP | 10-326852 | 12/1998 |
| JP | 11-307694 | 11/1999 |

* cited by examiner

CSP SEMICONDUCTOR DEVICE HAVING SIGNAL AND RADIATION BUMP GROUPS

This is a Divisional of U.S. application Ser. No. 10/259,484, filed Sep. 30, 2002, now issued on Jan. 11, 2005 as U.S. Pat. No. 6,841,873, the subject matter of which is incorporated herein by reference.

BACKGROUND OF THE INVENTION

1. Field of the Invention

The present invention generally relates to a semiconductor device, and more particularly, to a semiconductor device which has improved radiation efficiency.

This application is a counterpart of Japanese patent application, Serial Number 313592/2001, filed Oct. 11, 2001, the subject matter of which is incorporated herein by reference.

2. Description of the Related Art

Recently, spread of the mobile terminal has been accelerated toward smaller, thinner and lighter mobile terminals. In order to achieve compactness, effort has been made to reduce the size of the semiconductor device mounted on the mobile terminal. Such efforts are focused on the development of the semiconductor devices having a semiconductor package in the size of a chip referred to as Chip Size Package (hereinafter CSP).

The size of CSP is substantially the same as that of the chip or slightly larger than the chip. There is the resin sealed type semiconductor device which is referred to as a Wafer Level Chip Size Package/Wafer Level Chip Scale Package (hereinafter W-CSP) among CSP. The size of W-CSP is the same as that of the chip.

The conventional CSP type semiconductor device will be described with reference to FIG. 10. FIG. 10(a) is a plane view showing the conventional semiconductor device having a wafer level chip size package structure individually divided from a wafer. FIG. 10(b) is a cross sectional view taken along line D–D' of the conventional semiconductor device shown in FIG. 10(a).

The conventional semiconductor device comprises a semiconductor chip 1000, an oxide film 1001, a plurality of electrical pads 1002, an insulating film 1003, a plurality of redistributions 1004, a plurality of posts 1005, a plurality of solder bumps 1006 and a sealing resin 1007. The semiconductor chip 1000 has a main surface having a central area 1000a and a peripheral area 1000b surrounding the central area 1000a. A circuit, e.g. a transistor etc, is formed on the main surface in the peripheral area 1000b. There is nothing on the main surface in the central area 1000a. The oxide film 1001 is formed on the main surface of the semiconductor chip 1000 in all areas. The electrical pads 1002 are formed on the oxide film 1001 in the peripheral area 1000b. The electrical pads 1002 are electrically connected to the circuit formed on the semiconductor chip 1000. The insulating film 1003 is formed on the oxide film 1001 in all areas and on the electrical pads 1002. The redistributions 1004 are formed on the electrical pads 1002 and the insulating film 1003 in the peripheral area 1000b. The redistributions 1004 are electrically connected to the electrical pad 1002. The posts 1005 are formed on the redistributions 1004 being formed on the insulating film 1003 and are electrically connected to the redistributions 1004. The solder balls 1006 are formed on an end of the posts 1005 and are electrically connected to the posts 1005. The sealing resin 1007 seals the insulating film 1003, the redistributions 1004 and side surfaces of the posts 1005. The heat generated near the main surface of the semiconductor chip 1000 in the conventional semiconductor device, is radiated via the electrical pads 1002, the redistributions 1004, the posts 1005 and the solder bumps 1006 to outside of the semiconductor device.

However, the oxide film 1001 has a low thermal conductivity, and is disposed between the main surface of the semiconductor chip 1000 and the electrical pads 1002. Therefore, the heat of the semiconductor chip 1000 is hard to conduct to the electrical pads 1002. In addition, the conventional semiconductor device does not allow a lot of heat to escape. Consequently, the heat generated near the main surface of the semiconductor chip 1000 is not sufficiently dissipated.

SUMMARY OF THE INVENTION

It is an object of the present invention to provide a semiconductor device that may improve radiation efficiency.

It is another object of the present invention to provide a method for making a semiconductor device that may reduce manufacturing costs.

It is still another object of the present invention to provide a method for making a semiconductor device that may reduce manufacturing steps.

It is further object of the present invention to provide a method of making a semiconductor device that may reduce a manufacturing time period.

According to one aspect of the present invention, for achieving the above object, there is provided a semiconductor device, is provided with a semiconductor device comprising a semiconductor device comprises a semiconductor chip which has a first surface, a pad which is formed directly on the first surface, an oxide film which is formed on the first surface, an insulating film which is formed on the oxide film and a part of the pad, a conductive film which is formed on the insulating film and the pad, a sealing material which covers a part of the conductive film and the insulating film and a bump which is formed over the conductive film, wherein the bump is exposed from a surface of the sealing material.

The above and further objects and novel features of the invention will more fully appear from the following detailed description, appended claims and the accompanying drawings.

DETAILED DESCRIPTION OF THE PREFERRED EMBODIMENTS

In what follows, the present invention will be explained with embodiments of the present invention. However, the invention is not limited to the specific embodiments. Moreover, not all the combinations of the characteristics of the present invention described in the embodiments are essential to the problem solving means by the present invention.

First Preferred Embodiment

Figure 1:
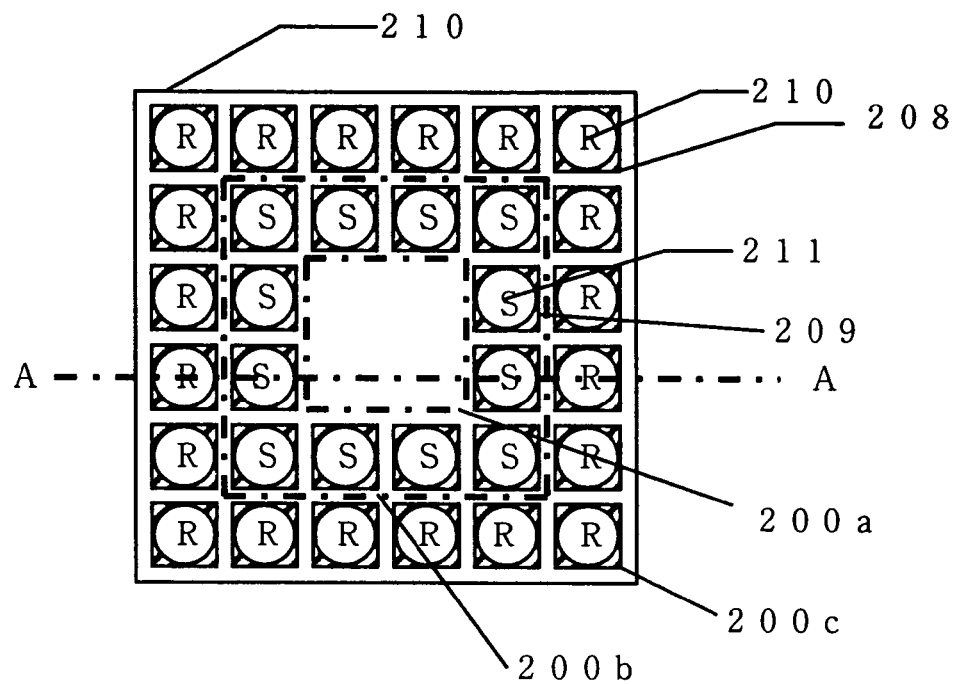
FIG. 1 is a plane view showing a semiconductor device according to a first preferred embodiment of the present invention.
Figure 2:
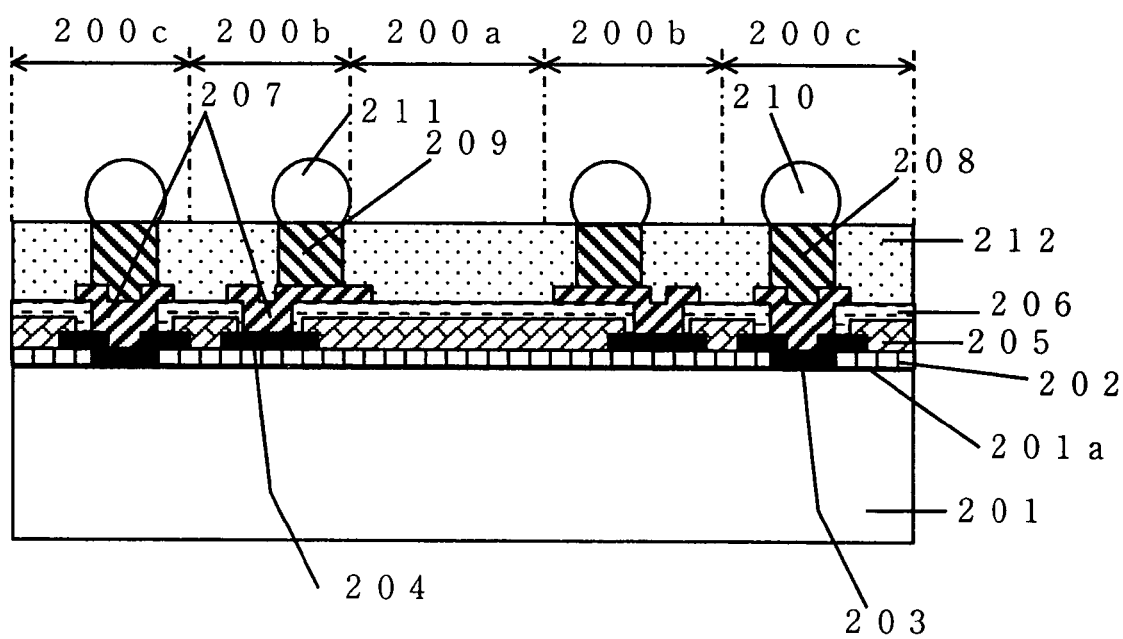
FIG. 2 is a cross sectional view taken line A–A' of the semiconductor device shown in FIG. 1.

A semiconductor device according to a first preferred embodiment of the present invention will be described with reference to FIGS. 1–2. FIG. 1 is a plane view showing the semiconductor device having a wafer level chip size package structure individually divided from a wafer. FIG. 2 is a cross sectional view taken along line A–A' of the semiconductor device shown in FIG. 1. In FIG. 1, the mark 'S' being written at the solder bump 211 shows a bump for transmitting a signal and the mark 'R' being written at the solder bump 210 shows a bump for conducting heat.

The semiconductor device according to the first preferred embodiment of the present invention comprises a semiconductor chip 201, a field oxide film 202, a plurality of radiation pads (first pads) 203, a plurality of electrical pads (second pads) 204, a passivation film 205, a polyimide film 206, a plurality of conductive films (redistribution) 207, a plurality of radiation posts (first posts) 208, a plurality of electrical posts (second posts) 209, a plurality of radiation bumps (first bumps) 210, a plurality of electrical bumps (second bumps) 211, a sealing resin (sealing material) 212. Owing to an explanatory circumstance, the number of the pads, the redistributions, the posts and the bumps is limited in FIG. 2, and will be often referred to in the singular in the paragraphs that follow.

The semiconductor chip 201 has a main surface (first surface) 201a. The main surface 201a has a central area 200a, an intermediate area 200b surrounding the central area 200a and a peripheral area 200c surrounding the intermediate area 200b. A circuit, e.g. a transistor or the like, is formed on the main surface 201a in the intermediate area 200b. The field oxide film 202 is formed on the main surface 201a in all areas. The radiation pads 203 are preferably made of aluminum or the like, and are formed on the main surface 201a and the field oxide film 202 in the peripheral area 200c. The radiation pads 203 do not electrically connect to the circuit formed on main surface 201a. The radiation pads 203 contact the semiconductor chip 201, directly. The electrical pads 204 which are preferably made of aluminum or the like, are formed on the field oxide film 202 in the intermediate area 200b. The electrical pads 204 electrically connect to the circuit formed on main surface 201a. The passivation film 205 is formed on the radiation pads 203, the electrical pads 204 and the field oxide film 202 in all areas. The polyimide film 206 is formed on the radiation pads 203, the electrical pads 204 and the passivation film 205 in all areas. The conductive film 207 comprises a first conductive film 207a contacting the radiation pad 203 and a second conductive film 207b contacting the electrical pad 204. The conductive film 207 is the dual layer structure and is preferably made of titanium film and copper or aluminum film or the like. First, titanium film is formed on the radiation pads 203 or the electrical pads 204 and the polyimide film 206, and then copper or aluminum film is formed on the titanium film. The conductive film 207b electrically connects to the electrical pad 204. The radiation posts 208 are preferably made of copper or aluminum or the like, and each one has a first edge, a second edge and side surfaces. The radiation posts 208 are formed on the conductive film 207a which are formed on the radiation pads 203. The first edges of the radiation posts 208 contact the conductive film 207a. The electrical posts 209 are preferably made of copper or aluminum or the like, and each one has a first edge, a second edge and side surfaces. The electrical posts 209 are formed on the conductive film 207b which are formed on the polyimide film 206, and electrically connect to the conductive film 207b. The first edges of the electrical posts 209 contact the conductive film 207b. The radiation bumps 210 have a spherical shape and are preferably made of solder. Each of the radiation bumps 210 is mounted on the second edge of the radiation post 210. The electrical bumps 211 have a spherical shape and are preferably made of solder. Each of the electrical bumps 211 is mounted on the second edge of the electrical post 209. The shapes of the bumps 210, 211 may be hemispheres or arcs. The electrical bumps 211 electrically connect to the electrical posts 209. The sealing resin 212 which is preferably made of epoxy resin or the like, seals the conductive film 207, the polyimide film 206 and the side surfaces of the radiation posts 208 and the electrical posts 209.

The electrical pad 204, the conductive film 207b, the electrical post 209 and the electrical bump 211 are abbreviated as a signal bump group. The circuit formed on the semiconductor chip 210 and the electrical bumps 211 are electrically connected through the electrical pads 204, the conductive film 207b, and the electrical posts 209. The signal bump group transmits the electrical signal between the circuit formed on the semiconductor chip 201 and the electrical bumps 211. The semiconductor device of the present invention can transmit a signal to an external device through the electrical bump 211, when the semiconductor device is mounted on the external device through the electrical bumps 211. The radiation pad 203, the conductive film 207a, the radiation post 208 and the radiation bump 210 are abbreviated as a radiation bump group. The radiation bumps 210 radiate heat which is generated in the semiconductor chip 201 to outside the semiconductor device, through the radiation pads 203, the conductive film 207a and the radiation posts 209. By the way, the signal and radiation bump groups are not formed on the semiconductor chip 210 in the central area 200a.

For lack of space in FIG. 1, each of the radiation bump group and the signal bump group is only shown as one. However, it goes without saying that the number of the radiation bump group and the signal bump group should not be limited. In FIG. 1, the radiation bump group is formed as the farthest row from the center of the main surface 201a. However, if heat being generated in the semiconductor device can be radiated efficiently, all structure elements of the row do not have to be the radiation bump group and it may be a few.

The semiconductor device according to the first preferred embodiment of the present invention has the following effect.

(1) The radiation pads are directly formed on the main surface of the semiconductor chip without the field oxide film. Heat generated in the semiconductor chip is directly conducted to the radiation pads, and is radiated to the outside of the semiconductor device through the radiation posts and the radiation bumps. Therefore, the semiconductor device according to the first preferred embodiment of the present invention can radiate heat efficiently as compared with the conventional semiconductor device. Thus, the semiconductor device according to the first preferred embodiment of the present invention can reduce thermal resistance and control high temperature of the semiconductor chip as compared with the conventional semiconductor device. As a result, the semiconductor device according to the first preferred embodiment has a longer lifetime.

(2) The radiation bump group is formed in the row which is the farthest from the center of the main surface of the semiconductor chip. In other words, the signal bump group is formed more inward than the radiation bump group. Therefore, even if water makes inroads into the semiconductor chip from the side surface of the semiconductor device, the radiation bump group can hinder it from making inroad toward the signal bump group. Thus, the signal bump group is protected against erosion by water. As a result, the semiconductor device according to the first preferred embodiment has a longer lifetime.

Second Embodiment

Figure 3:
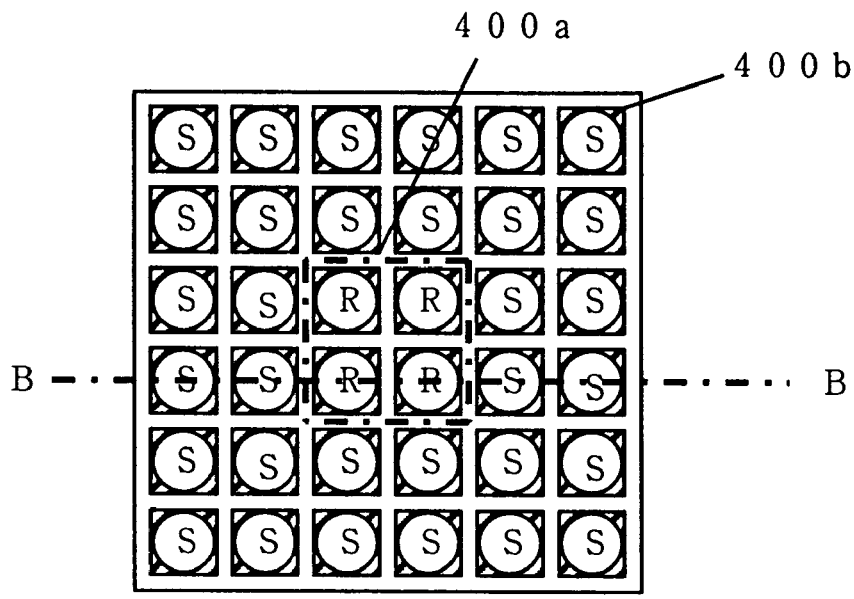
FIG. 3 is a plane view showing a semiconductor device according to a second preferred embodiment of the present invention.
Figure 4:
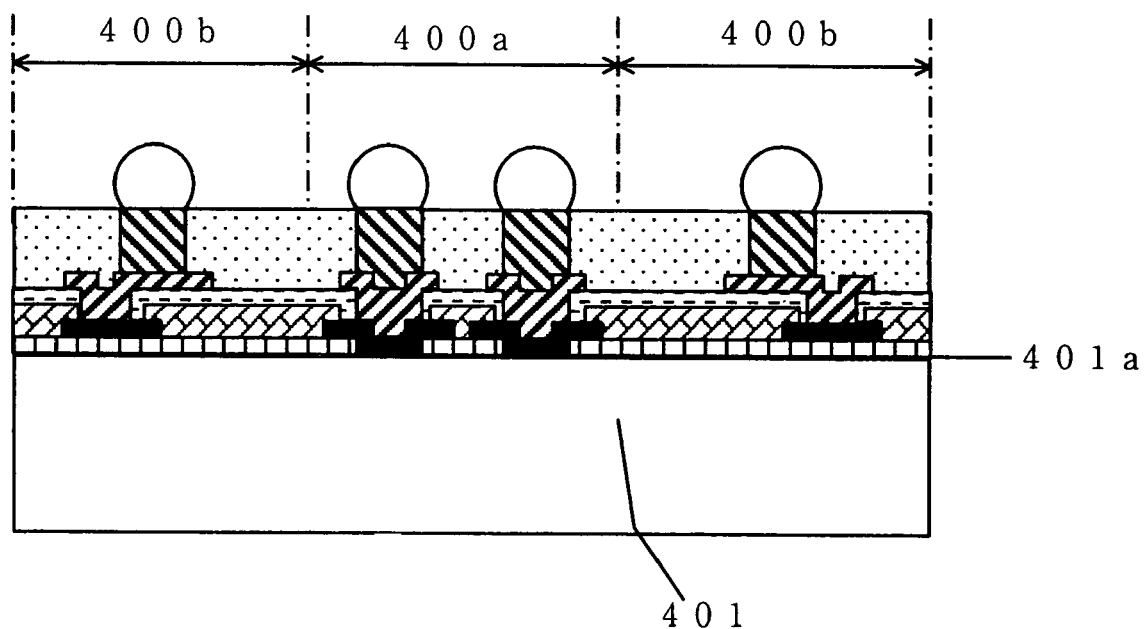
FIG. 4 is a cross sectional view taken line B–B' of the semiconductor device shown in FIG. 3.

A semiconductor device according to a second preferred embodiment of the present invention will be described with reference to FIGS. 3–4. FIG. 3 is a plane view showing the semiconductor device having a wafer level chip size package structure individually divided from a wafer. FIG. 4 is a cross sectional view taken line B–B' of the semiconductor device shown in FIG. 3. The elements corresponding to the elements shown in the first preferred embodiment are given the same numerals, in order to avoid dual explanations about the same elements.

The semiconductor chip 401 has a main surface (first surface) 401a. The main surface 401a has a central area 400a and a peripheral area 400b surrounding the central area 400a. A circuit, e.g. a transistor or the like, is formed on the main surface 401a in the peripheral area 400b. As shown in FIG. 4, the radiation bump group (radiation pad, conductive film, radiation post and radiation bump) is formed on the semiconductor chip in the central area 400a. The signal bump group (electrical pad, conductive film, electrical post and electrical bump) is formed on the semiconductor chip in the peripheral area 400b.

For lack of space in FIG. 3, there are four radiation bump groups in the central area 400a. However, it goes without saying that the number of the radiation bump group should not be limited. In FIG. 3, the radiation bump group is not formed in the peripheral area 400b. However, in order to radiate heat generated in the semiconductor device efficiently, the radiation bump group may be formed in the peripheral area 400b.

The semiconductor device according to the second preferred embodiment of the present invention can have the same effect (1) being described in the first preferred embodiment of the present invention.

Furthermore, the semiconductor device according to the second preferred embodiment of the present invention can have the following effect.

(3) The radiation bump group is formed on the semiconductor chip in the central area which is not used in the conventional semiconductor device. Therefore, it is not necessary to rearrange the circuit and the electrical pads etc. on the semiconductor chip in order to form the radiation bump group.

Third Embodiment

Figure 5:
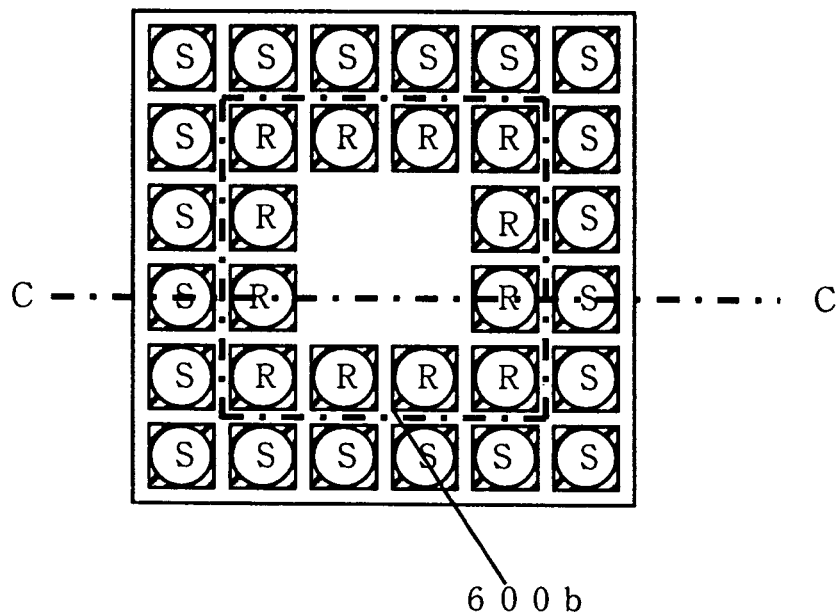
FIG. 5 is a plane view showing a semiconductor device according to a third preferred embodiment of the present invention.
Figure 6:
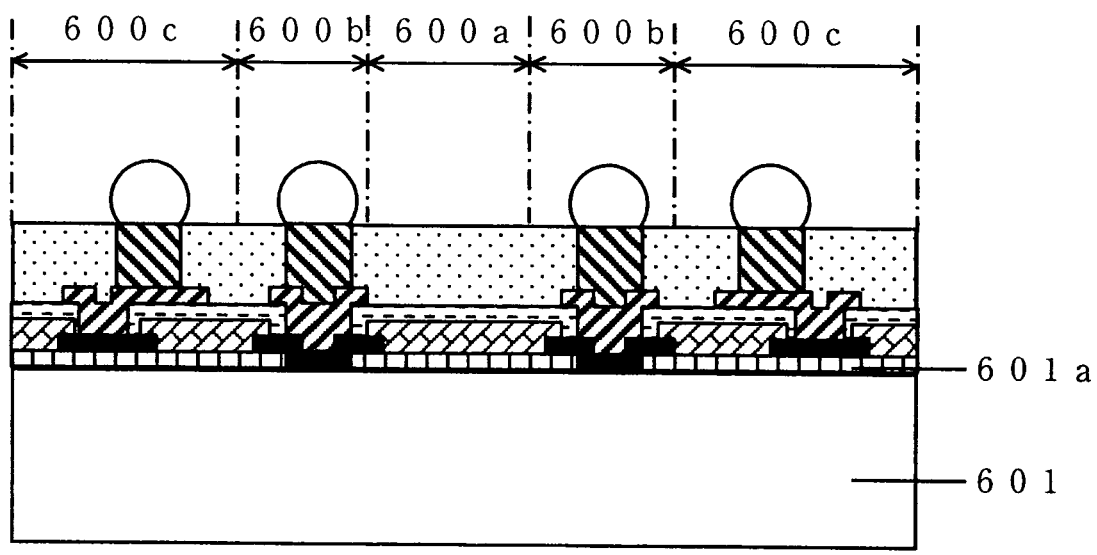
FIG. 6 is a cross sectional view taken line C–C' of the semiconductor device shown in FIG. 5.

A semiconductor device according to a third preferred embodiment of the present invention will be described with reference to FIGS. 5–6. FIG. 5 is a plane view showing the semiconductor device having a wafer level chip size package structure individually divided from a wafer. FIG. 6 is a cross sectional view taken line C–C' of the semiconductor device shown in FIG. 5. The elements corresponding to the elements shown in the first or second preferred embodiments are given the same numerals, in order to avoid dual explanations about the same elements.

The semiconductor chip 601 has a main surface (first surface) 601a. The main surface 601a has a central area 600a, an intermediate area 600b surrounding the central area 600a and a peripheral area 600c surrounding the intermediate area 600b. A circuit, e.g. a transistor or the like, is formed on the main surface 601a in the intermediate and/or peripheral areas 600b, 600c. As shown in FIG. 6, the radiation bump group (radiation pad, conductive film, radiation post and radiation bump) is formed the most inward in plurality of the bumps being formed on the semiconductor chip in the intermediate area 600b. In FIG. 5, the radiation bump group is not formed in the peripheral area 600c. However, in order to radiate heat generated in the semiconductor device efficiently, the radiation bump group may be formed in the peripheral area 600c. By the way, the signal and radiation bump groups are not formed on the semiconductor chip in the central area 600a.

The semiconductor device according to the third preferred embodiment of the present invention can have the same effect (1) being described in the first preferred embodiment of the present invention.

Furthermore, the semiconductor device according to the third preferred embodiment of the present invention can have the following effect.

(4) The radiation bump group is formed the most inward in plurality of rows which the bumps are formed on the semiconductor chip in the intermediate area. Therefore, the semiconductor device according to the third embodiment of the present invention can effectively radiate heat generated in the semiconductor device.

Fourth Embodiment

Figure 7:
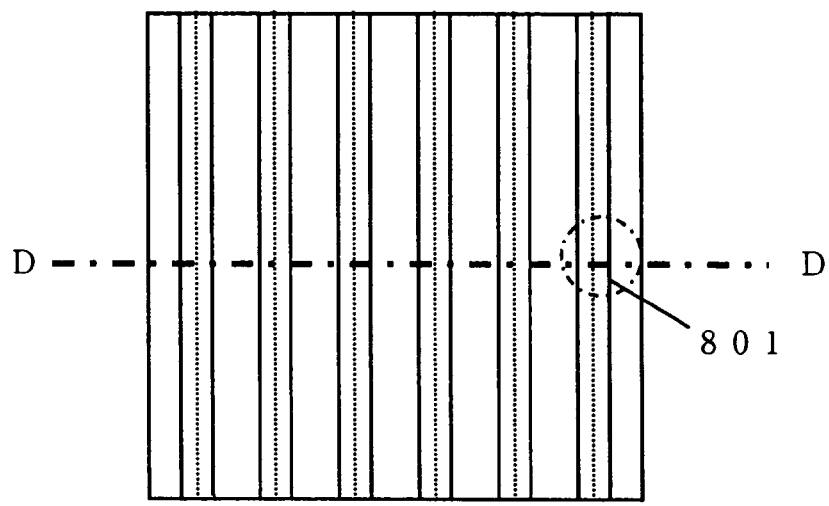
FIG. 7 is a plane view showing a back surface of a semiconductor device according to a fourth or a fifth preferred embodiments of the present invention.
Figure 8:
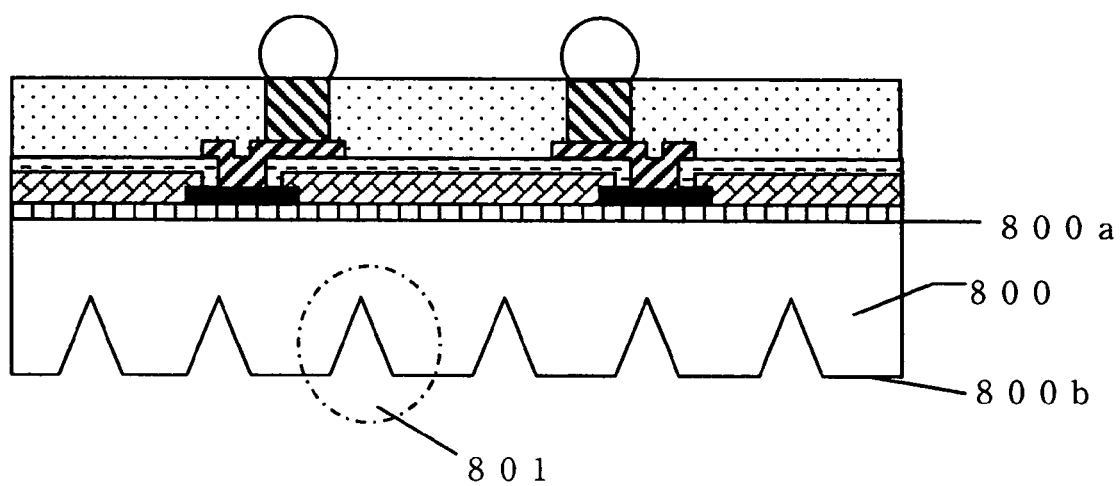
FIG. 8 is a cross sectional view taken line D–D' of the semiconductor device according to the fourth preferred embodiment shown in FIG. 7.

A semiconductor device according to a fourth preferred embodiment of the present invention will be described with reference to FIGS. 7–8. FIG. 7 is a plane view showing the semiconductor device having a wafer level chip size package structure individually divided from a wafer. FIG. 8 is a cross sectional view taken line D–D' of the semiconductor device shown in FIG. 7. The elements corresponding to the elements shown in the first, second or third preferred embodiments are given the same numerals, in order to avoid dual explanations about the same elements.

The semiconductor chip 800 has a main surface (first surface) 800a and a back surface (second surface) 800b. A circuit, e.g. a transistor or the like, is formed on the main surface 800a. A plurality of grooves 801 are formed on the back surface 800b. Each of the grooves 801 has a V-shape. Each of the grooves 801 is arranged in parallel each other. FIGS. 7–8 show that the grooves 801 are evenly spaced across the entire back surface 800b. Each of the grooves 801 is arranged from a certain edge of the back surface 800b to another edge being in opposition to the certain edge. It goes without saying that the grooves may be formed in a grid pattern. The width, the depth and the number of each groove should be set in consideration of the strength (stress) of the semiconductor device. The groove 801 is formed by etching to become a V-shape.

Figure 9:
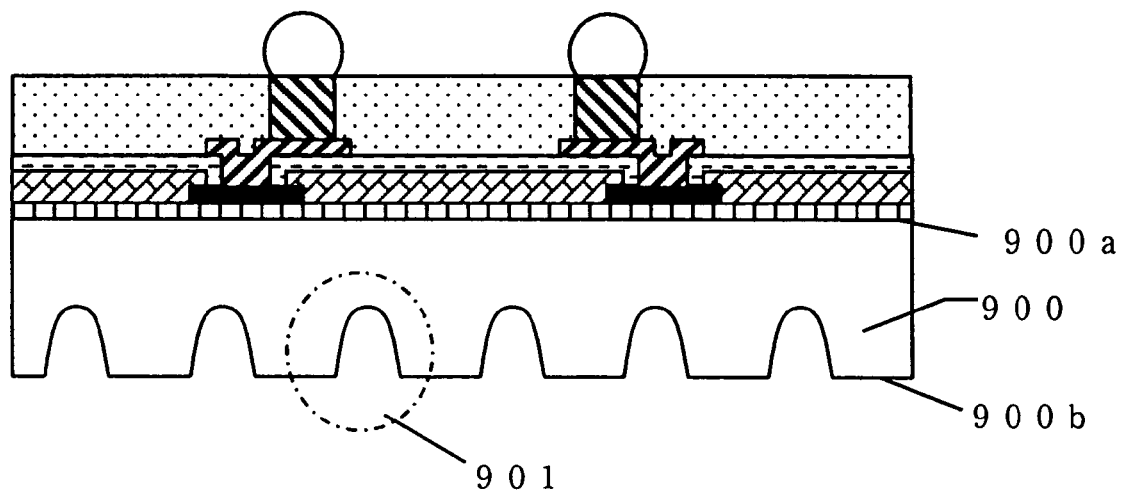
FIG. 9 is a cross sectional view taken line D–D' of the semiconductor device according to the fifth preferred embodiment shown in FIG. 7.
Figure 10:
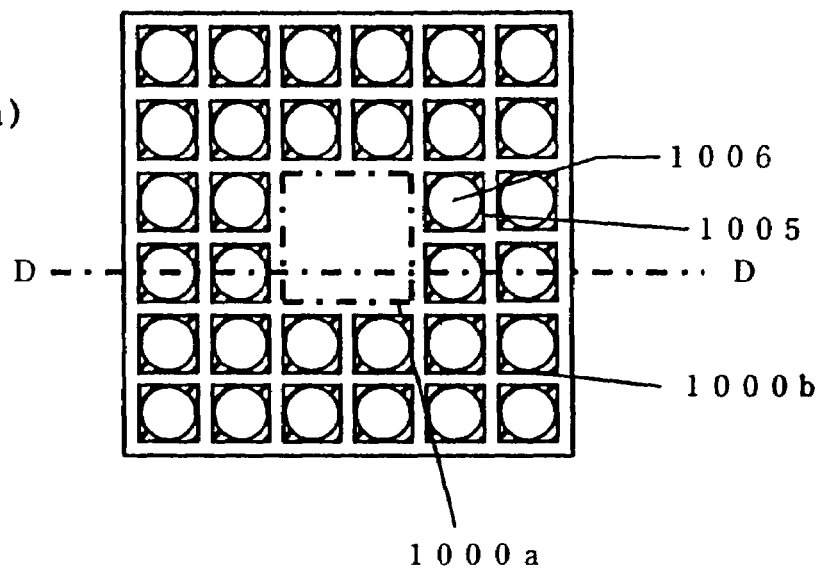
FIG. 10 is a cross sectional view of the conventional semiconductor device.
Figure 10:
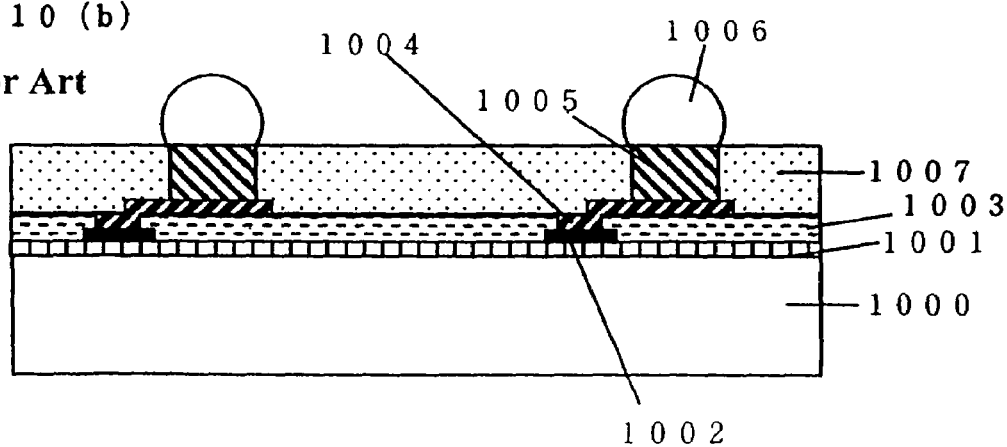

By the way, FIG. 9 is a cross sectional view of the semiconductor device showing the varied pattern of the fourth preferred embodiment. As shown in FIG. 9, the groove 901 does not have the V-sharp but a U-sharp. As mentioned above, the width, the depth and the number of each groove should be set in consideration of the strength (stress) of the semiconductor device. The groove 901 can be formed on the back surface 900b at the same time in a dicing process of the semiconductor device. There is no need to use the mask for forming the slit of the U-sharp, because the method does not have the etching step.

The semiconductor device according to the fourth preferred embodiment of the present invention can have the following effect.

(5) The slits are formed on the back surface of the semiconductor device. The distance between the main surface which has the circuits and the bottom of the back surface becomes short, and a surface area of the back surface becomes large. Therefore, the semiconductor device according to the fourth preferred embodiment of the present invention can effectively radiate heat generated in the semiconductor device.

(6) When the semiconductor device has the slit of the U-shape, there is no need to use the mask for forming the slit. Therefore, the semiconductor device according to the fourth preferred embodiment of the present invention can improve a working efficiency and reduce an increase of the costs.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A CSP type semiconductor device, comprising:
   a semiconductor chip having a main surface on which a circuit is formed and a back surface opposite to the main surface, wherein the back surface has a first edge, a second edge opposite the first edge, and a plurality of grooves extending from the first edge to the second edge;
   a pad which is formed on the main surface of the semiconductor chip;
   an oxide film which is formed on the main surface of the semiconductor chip, wherein the oxide film has a main surface and a back surface facing to the main surface of the semiconductor chip;
   an insulating film which is formed on the main surface of the oxide film and a part of the pad;
   a conductive film which is formed on the insulating film and the pad;
   a sealing material which covers the insulating film and a part of conductive film; and
   a first bump which is formed over the insulating film, wherein the first bump is exposed from the sealing material.

2. The CSP type semiconductor device according to claim 1, further comprising a second bump being formed between the insulating film and the first bump.

3. The CSP type semiconductor device according to claim 1, wherein the grooves are V-shaped.

4. The CSP type semiconductor device according to claim 1, wherein the grooves are U-shaped.

5. The CSP type semiconductor device according to claim 1, wherein the pad is formed directly on the main surface of the semiconductor chip.

6. The CSP type semiconductor device according to claim 1, wherein the grooves are parallel.

7. The CSP type semiconductor device according to claim 6, wherein the grooves are substantially evenly spaced across the entire back surface.

8. The CSP type semiconductor device according to claim 1, wherein the grooves are arranged in a grid.

9. A semiconductor device, comprising:
   a semiconductor chip having a main surface on which a circuit is formed and a back surface opposite to the main surface, wherein the back surface has a first edge, a second edge opposite the first edge, and a plurality of grooves extending from the first edge to the second edge;
   a pad which is formed on the main surface of the semiconductor chip; and
   an oxide film which is formed on the main surface of the semiconductor chip.

10. The semiconductor device according to claim 9, further comprising a bump which is formed over the main surface of the semiconductor chip.

11. The semiconductor device according to claim 9, wherein the grooves are V-shaped.

12. The semiconductor device according to claim 9, wherein the grooves are U-shaped.

13. The semiconductor device according to claim 9, wherein the pad is formed directly on the main surface of the semiconductor chip.

14. The semiconductor device according to claim 9, wherein the grooves are parallel.

15. The semiconductor device according to claim 14, wherein the grooves are substantially evenly spaced across the entire back surface.

16. The semiconductor device according to claim 9, wherein the grooves are arranged in a grid.

* * * * *